(12) United States Patent
Oka et al.

(10) Patent No.: US 6,461,532 B1
(45) Date of Patent: Oct. 8, 2002

(54) PIEZOELECTRIC CERAMIC MATERIAL

(75) Inventors: Hitoshi Oka; Masakazu Hirose; Yasuo Watanabe; Junji Terauchi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/696,960

(22) Filed: Oct. 27, 2000

(30) Foreign Application Priority Data

Oct. 29, 1999 (JP) ............................................ 11-310177
Oct. 13, 2000 (JP) ...................................... 2000-313936

(51) Int. Cl.⁷ ........................ C04B 35/462; H03H 9/17; H01L 41/107; H01L 41/187; H01L 41/24
(52) U.S. Cl. ................................ 252/62.9 R; 501/134; 501/135; 501/136
(58) Field of Search .................... 501/134, 135, 501/136; 252/62.9 R

(56) References Cited

U.S. PATENT DOCUMENTS

| | | | |
|---|---|---|---|
| 4,978,646 A | 12/1990 | Bardhan et al. | 501/134 |
| 6,090,306 A | 7/2000 | Tsubokura et al. | 252/62.9 R |
| 6,129,886 A | 10/2000 | Tachimoto et al. | 264/614 |
| 6,241,908 B1 * | 6/2001 | Hirose et al. | 252/62.9 R |
| 6,248,254 B1 * | 6/2001 | Kimura et al. | 252/62.9 R |

FOREIGN PATENT DOCUMENTS

| | | | |
|---|---|---|---|
| JP | 50-34313 | * | 4/1975 |
| JP | 7-114824 | * | 5/1995 |
| JP | 2000-143340 | | 5/2000 |
| JP | 2001-181030 | | 7/2001 |

OTHER PUBLICATIONS

Hirose et al, "Piezoelectric Properties of SrBi4Ti4O15–Based Ceramics", Jpn. J. Appl. Phys. vol. 38, Part 1, No. 9B, 9/99, pp. 5561–5563.*

Oka et al, "The Thickness–Extensional and Thickness–Shear Vibration Mode Characteristics of Bismuth Layer–Structure Compounds", 9$^{th}$ US–Japan Seminar on Dielectric&Piezoelectric Ceramics, 11/99, pp 119–122.*

Oka et al, "The Thickness–Shear Vibration Mode Characteristics of SrBi4Ti4O15 Ceramics", 17$^{th}$ Applied Ferroelectric Meeting Preprint, 4/00, pp. 111–112.*

Oka et al, "The Thickness–Shear Vibration Mode Characteristics of SrBi4Ti4O15 Ceramics", Jpn. J. Appl. Phys. vol. 39, Part 1, No. 9B, 9/00, pp. 5613–5615.*

(List continued on next page.)

*Primary Examiner*—C. Melissa Koslow
(74) *Attorney, Agent, or Firm*—Oblon, Spivak, McClelland, Maier & Neustadt, P.C.

(57) ABSTRACT

A piezoelectric ceramic material comprising a bismuth layer compound containing $M^{II}$, Bi, Ti and O wherein $M^{II}$ is selected from Sr, Ba and Ca, and containing $M^{II}Bi_4Ti_4O_{15}$ type crystals, wherein $M^{II}$, is represented by $Sr_xBa_yCa_z$ wherein $x+y+z=1$, utilizes thickness shear vibration when $0 \leq x \leq 1$, $0 \leq y \leq 0.9$, and $0 \leq z \leq 1$, and thickness extensional vibration when $0 \leq x < 0.9$, $0 \leq y \leq 0.9$, and $0 \leq z < 1$. Also provided is a piezoelectric ceramic material comprising a bismuth layer compound containing Ca, Bi, Ti, Ln and O wherein Ln is a lanthanoid, and containing $CaBi_4Ti_4O_{15}$ type crystals, wherein the atomic ratio $Ln/(Ln+Ca)$ is in the range: $0<Ln/(Ln+Ca)<0.5$. These piezoelectric ceramic materials are free of lead, and have a high Curie point and improved piezoelectric characteristics.

28 Claims, 3 Drawing Sheets

OTHER PUBLICATIONS

H. Oka, et al., The 9th US–Japan Seminar on Dielectric & Piezoelectric Ceramics, pp. 119–122, "The Thickness–Extensional and Thickness–Shear Vibration Mode Characteristics of Bismuth Layer–Structure Compounds," Nov. 2–5, 1999.

H. Oka, et al., Japanese Journal of Applied Physics, vol. 39, No. 9B, pp. 5613–5615, "Thickness–Shear Vibration Mode Characteristics of $SrBi_4Ti_4O_{15}$–Based Ceramics," Sep. 2000.

H. Oka, et al., The 17th Applied Ferroelectric Meeting Preprint, pp. 111–112, "The Thickness–Shear Vibration Mode Characteristics of $SrBi_4Ti_4O_{15}$ Based Ceramics," Apr. 24–27, 2000.

M. Hirose, et al., Japanese Journal of Applied Physics, vol. 38, No. 9B, pp. 5561–5563, "Piezoelectric Properties of $SrBi_4Ti_4O_{15}$–Based Ceramics", Sep. 1999.

A. Pignolet, et al., Integrated Ferroelectrics, vol. 26, pp. 21–29, "Epitaxial Bismuth–Layer–Structured Perovskite Ferroelectric Thin Films Grown by Pulsed Laser Deposition", 1999.

K. M. Satyalakshmi, et al., Applied Physics Letters, vol. 74, No. 4, pp. 603–605, "$BaBi_4Ti_4O_{15}$ Ferroelectric Thin Films Grown by Pulsed Laser Deposition", Jan. 25, 1999.

* cited by examiner

PIEZOELECTRIC CERAMIC MATERIAL

This invention relates to piezoelectric ceramic materials for use in resonators, pressure sensors and the like.

BACKGROUND OF THE INVENTION

The piezoelectric material is a material having both the piezoelectric effect that electric polarization changes upon application of external stress and the inverse piezoelectric effect that the application of an electric field produces a mechanical distortion. The piezoelectric material is used in sensors for measuring pressure and distortion, resonators, and actuators.

Most piezoelectric materials currently used in practice are ferroelectric materials having the perovskite structure including tetragonal or rhombohedral PZT ($PbZrO_3$–$PbTiO_3$ solid solution) materials and tetragonal PT ($PbTiO_3$) materials. Distinct performance requirements are met by adding various auxiliary components to these materials.

However, many piezoelectric materials of the PZT and PT systems have a Curie point in the range of about 300 to 350° C. as long as they have practically acceptable compositions. Since the currently used soldering step is generally at a temperature of about 230 to 250° C., piezoelectric materials having a Curie point of about 300 to 350° C. tend to deteriorate their properties during the soldering step. If lead-free solders are developed to the practical level, the temperature of the soldering step would become higher. It is thus very important for piezoelectric materials to have a higher Curie point.

Prior art lead base piezoelectric materials are undesirable from the ecological and pollution standpoints because they contain a substantial content (about 60 to 70% by mass) of lead oxide (PbO) which is highly volatile even at low temperatures. More particularly, when such lead base piezoelectric materials are prepared as ceramics and single crystals, heat treatments such as firing and melting are indispensable, upon which an amount of lead oxide will volatilize and diffuse into the air, the amount being substantial when considered from the industrial level. Lead oxide can be recovered as long as it is released in the manufacturing stages. However, few effective means are currently available for recovering the lead oxide in piezoelectric materials after delivery to the market as industrial products. If a substantial amount of lead oxide is released from such products to the environment, it surely becomes a cause of pollution.

One of well-known lead-free piezoelectric materials is $BaTiO_3$ having the perovskite structure belonging to the tetragonal system. This material, however, is impractical since its Curie temperature is as low as 120° C. JP-A 9-100156 describes $(1-x)(Bi_{1/2}Na_{1/2})TiO_3-xNaNbO_3$ solid solutions of the perovskite structure, none of which have a Curie temperature in excess of 370° C.

Bismuth layer compounds are known as the piezoelectric material which can have a Curie point in excess of 500° C. Regrettably, because of the lack of lead, bismuth layer compounds have a low Qmax which is crucial in the application to resonators. Here Qmax is tanθmax wherein θmax is a maximum phase angle. More specifically, provided that X is a reactance and R is a resistance, Qmax is a maximum of Q ($=|X|/R$) between the resonance frequency and the antiresonance frequency. The greater the Qmax, the more stable becomes oscillation. Also, oscillation at a lower voltage becomes possible.

The Preprint of the 16th Applied Ferroelectric Meeting (May 26–29, 1999), pp. 97–98, includes a report about a lead-free bismuth layer compound having improved Qmax. The lead-free bismuth layer compound described in this report is $(Sr_{1-x}Me_x)Bi_4Ti_4O_{15}$ wherein Me is Ba, Ca, La, Sm or Gd. Ba and Ca are added in a range of $x \leq 0.1$; Sm and Gd are added in a range of $x \leq 0.4$; and La is added in a range of $x \leq 0.5$. In the report, Qmax was measured in the thickness extensional fundamental vibration mode. FIG. 2 in the report shows that Qmax is improved by the addition of La whereas Qmax is reduced when Ba or Ca is added.

SUMMARY OF THE INVENTION

An object of the invention is to provide a novel and improved piezoelectric ceramic material which is free from lead and has a high Curie point and improved piezoelectric characteristics.

In a first aspect, the invention provides a piezoelectric ceramic material comprising a bismuth layer compound containing $M^{II}$, Bi, Ti and O wherein $M^{II}$ is at least one element selected from the group consisting of Sr, Ba and Ca, and containing $M^{II}Bi_4Ti_4O_{15}$ type crystals, wherein $M^{II}$ is represented by the formula: $Sr_xBa_yCa_z$ wherein x, y and z representing the atomic proportions of Sr, Ba and Ca, respectively, satisfy $x+y+z=1$, $0 \leq x \leq 1$, $0 \leq y \leq 0.9$, and $0 \leq z \leq 1$. This piezoelectric ceramic material utilizes thickness shear vibration. Preferably, y is in the range: $x/6+0.2 \leq y \leq 0.8$.

In a second aspect, the invention provides a piezoelectric ceramic material comprising a bismuth layer compound containing $M^{II}$, Bi, Ti and O wherein $M^{II}$ is at least one element selected from the group consisting of Sr, Ba and Ca, and containing $M^{II}Bi_4Ti_4O_{15}$ type crystals having a c-axis length of at least 41.00 Å. This piezoelectric ceramic material utilizes thickness shear vibration. Preferably, the $M^{II}Bi_4Ti_4O_{15}$ type crystals have a c-axis length of at least 41.30 Å and also preferably, up to 41.80 Å.

In a third aspect, the invention provides a piezoelectric ceramic material comprising a bismuth layer compound containing $M^{II}$, Bi, Ti and O wherein $M^{II}$ is at least one element selected from the group consisting of Sr, Ba and Ca, and containing $M^{II}Bi_4Ti_4O_{15}$ type crystals, wherein $M^{II}$ is represented by the formula: $Sr_xBa_yCa_z$ wherein x, y and z representing the atomic proportions of Sr, Ba and Ca, respectively, satisfy $x+y+z=1$, $0 \leq x < 0.9$, $0 \leq y \leq 0.9$, and $0 \leq z < 1$. This piezoelectric ceramic material utilizes thickness extensional vibration. Preferably, y is in the range:

$y \leq -0.8\,x+0.9$.

Further preferably, z is in the range:

$-0.2\,x+0.3 \leq z$.

In the above embodiments, the piezoelectric ceramic material preferably further includes a lanthanoid oxide wherein Ln represents the lanthanoid, and the atomic ratio $Ln/(Ln+M_{II})$ is in the range: $0 \leq Ln/(Ln+M^{II}) \leq 0.5$. The piezoelectric ceramic material may further include manganese oxide.

In a fourth aspect, the invention provides a piezoelectric ceramic material comprising a bismuth layer compound containing Ca, Bi, Ti, Ln and O wherein Ln is a lanthanoid, and containing $CaBi_4Ti_4O_{15}$ type crystals, wherein the atomic ratio $Ln/(Ln+Ca)$ is in the range: $0 \leq Ln/(Ln+Ca) < 0.5$. The piezoelectric ceramic material may further include manganese oxide.

DESCRIPTION OF THE PREFERRED EMBODIMENT

Figure 1:
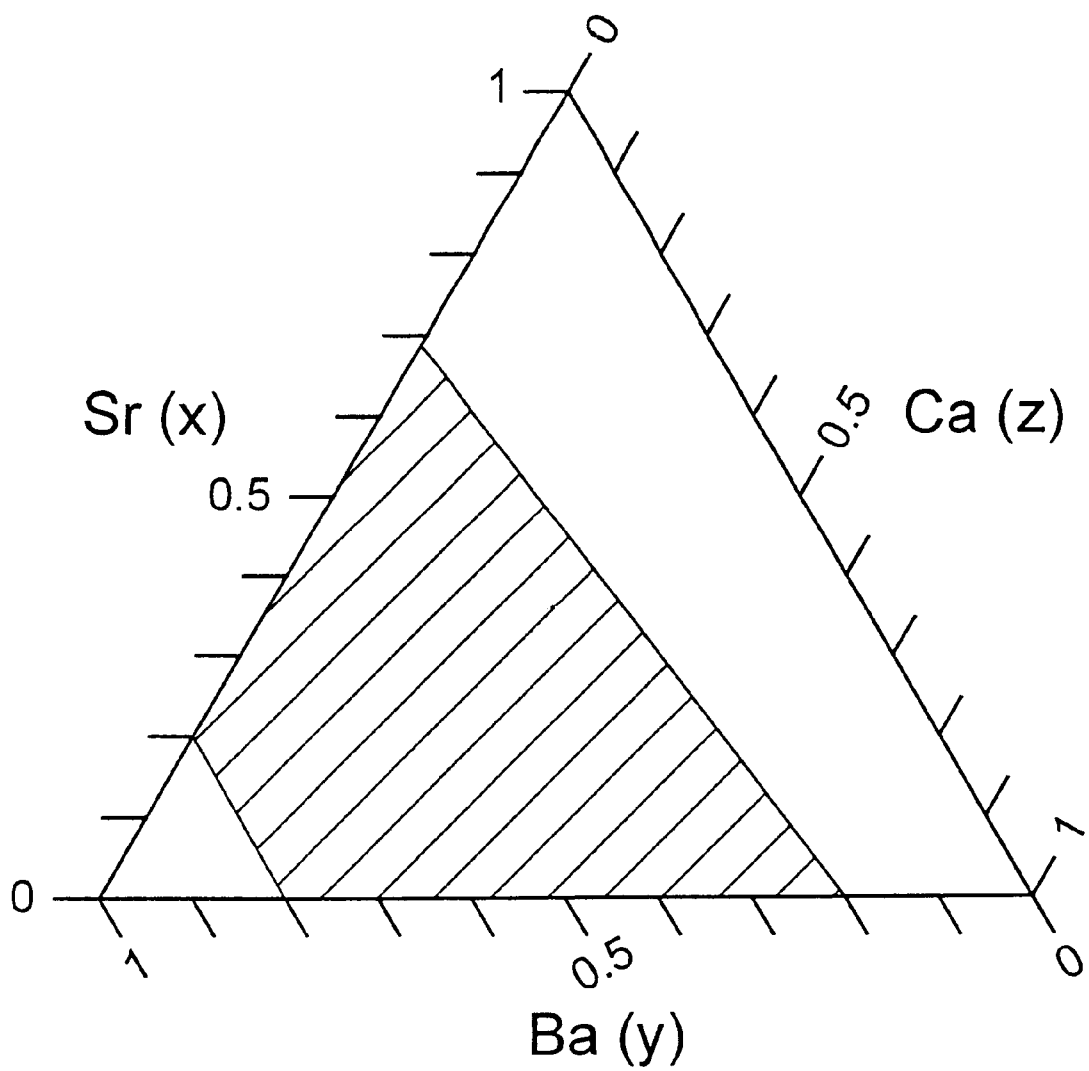
FIG. 1 is a ternary diagram showing the preferred compositional region of a piezoelectric ceramic material according to the first embodiment of the invention.

The first, second and third embodiments of the invention are described in sequence.

First Embodiment

The piezoelectric ceramic material in the first embodiment is comprised of a compound oxide in the form of a bismuth layer compound containing, preferably consisting essentially of $M^{II}$, bismuth (Bi), titanium (Ti) and oxygen (O) wherein $M^{II}$ is at least one element selected from the group consisting of strontium (Sr), barium (Ba) and calcium (Ca), and containing $M^{II}Bi_4Ti_4O_{15}$ type crystals. The piezoelectric ceramic material is utilized in the thickness shear vibration mode. The reason is described below.

Continuing a study on $SrBi_4Ti_4O_{15}$ base bismuth layer compounds, we found that a relatively high Qmax was obtained under thickness extensional fundamental vibration, but accompanied by more spurious vibrations which disabled stable oscillation. Then piezoelectric characteristics were measured under the third harmonic of thickness extensional vibration. It was found that spurious vibrations were reduced, but Qmax became lower. Further measuring piezoelectric characteristics under thickness shear fundamental vibration, we have found that spurious vibrations are minimized and a fully high Qmax is obtained.

The above-referred Preprint, pp. 101–102, reports that the second harmonic of the TE (thickness extensional vibration) mode can be trapped by using $CaBi_4Ti_4O_{15}$ which is a bismuth layer compound and constructing a two layer structure with an internal electrode sandwiched therebetween. This report shows resonance characteristics essentially free of spurious vibrations. However, green ceramic layers and the internal electrode must be co-fired before the two layer structure described in the report can be formed. While it is customary for multilayer parts such as multilayer ceramic capacitors to use Ag, Pd or an alloy thereof as the internal electrode material, the use of Ag is prohibited since the firing temperature of $CaBi_4Ti_4O_{15}$ is higher than the melting point of Ag. The use of Pd is also prohibited because Pd reacts with Bi upon firing. Therefore, platinum must be used as the internal electrode, despite its expense.

Provided that $M^{II}$ is represented by the formula: $Sr_xBa_y\text{-}Ca_z$ wherein x, y and z represent the atomic proportions of Sr, Ba and Ca, respectively, the effect of utilizing thickness shear vibration manifests when x, y and z are x+y+z=1, $0 \leq x \leq 1$, $0 < y \leq 0.9$, and $0 \leq z \leq 1$. If the proportion y that Ba accounts for in $M^{II}$ is too high, the piezoelectric ceramic material is likely to melt upon firing. This is also true in the second embodiment to be described later.

If the proportion z that Ca accounts for in $M^{II}$ is too high, the coercive electric field becomes higher to obstruct polarization. From this consideration, it is preferred that z<1, and more preferably $z \leq 0.8$. This is also true in the second embodiment to be described later. Where a lanthanoid oxide is included as will be described later, no problem arises with respect to polarization even when the proportion z of Ca in $M^{II}$ is too high, namely even when z=1.

We empirically found that when thickness shear vibration is used, the resonance frequency versus temperature curve becomes relatively sharp, that is, the temperature dependency of resonance frequency becomes relatively substantial. Through further experiments, we have found that the resonance frequency versus temperature curve can be fairly flat by optimizing the atomic proportion of elements in $M^{II}$. Specifically, in order to provide a flat resonance frequency versus temperature curve, the atomic proportion of elements in $M^{II}$ is set to meet the relationship:

$$x/6+0.2 \leq y < 0.8.$$

This range is depicted by the hatched region in the ternary diagram of FIG. 1.

We have also found that the resonance frequency versus temperature curve becomes fairly flat when the $M^{II}Bi_4Ti_4O_{15}$ type crystals have a c-axis length of at least 41.00 Å, preferably at least 41.30 Å. The c-axis length of $M^{II}Bi_4Ti_4O_{15}$ type crystals can be altered by replacing the constituent element (e.g., Sr) in part by another element having a different ion radius (e.g., Ba and/or Ca). Consequently, the substituting element and quantity thereof are properly selected such that the c-axis length may fall in the above range. It is understood that the resonance frequency versus temperature curve becomes substantially flat when the c-axis length is in the above range after substitution is made such that x and y representative of the atomic proportions of Sr and Ba in $M^{II}$ meet the relationship: $x/6+0.2 \leq y \leq 0.8$. Since a too long c-axis rather exacerbates the resonance frequency versus temperature curve, it is preferred that the c-axis length be not greater than 41.80 Å. Understandably, the c-axis length can be measured by x-ray diffractometry.

The subsequent description is common to the first, second and third embodiments.

Where it is desired to further improve Qmax, a lanthanoid oxide is preferably included in the piezoelectric ceramic material. The lanthanoid used herein includes La, Ce, Pr, Nd, Pm, Sm. Eu, Gd, Tb, Dy, Ho, Er, Tm, Yb, and Lu. Of these, at least one of La, Nd, Sm, Gd, Dy, Ho, Er, and Yb is preferred, with La being most preferred. Where the piezoelectric ceramic material contains a lanthanoid oxide wherein Ln represents the lanthanoid, the atomic ratio $Ln/(Ln+M^{II})$ is controlled to all in the range:

$$0 < Ln/(Ln+M^{II}) < 0.5,$$

preferably $0.03 \leq Ln/(Ln+M^{II}) \leq 0.3$. If $Ln/(Ln+M^{II})$ is greater than the range, Qmax is rather reduced. The improvement in Qmax by the addition of lanthanoid oxide is probably due to an improvement in sintering.

An improvement in Qmax is also achieved by incorporating manganese oxide into the piezoelectric ceramic material. A marked improvement in Qmax is achieved by adding both lanthanoid oxide and manganese oxide. Since a too high content of manganese oxide leads to a lower insulation resistance to interfere with polarization, the content of manganese oxide is preferably limited to less than 0.62% by mass, more preferably no more than 0.60% by mass, and most preferably no more than 0.43% by mass, calculated as MnO. On the other hand, in order that manganese oxide exert its addition effect, the content of manganese oxide is preferably at least 0.02% by mass calculated as MnO. A manganese oxide content of at least 0.03% by mass brings out a marked improvement in Qmax.

An improvement in Qmax is also achieved by incorporating cobalt oxide into the piezoelectric ceramic material. In order to fully exert the Qmax improving effect, cobalt oxide is preferably added in an amount of at least 0.1% by mass calculated as CoO. However, a too high content of cobalt oxide leads to a lower insulation resistance to interfere with polarization. Then the content of cobalt oxide is preferably limited to less than 0.7% by mass, more preferably no more than 0.5% by mass, calculated as CoO.

The piezoelectric ceramic material contains and preferably consists essentially of $M''Bi_4Ti_4O_{15}$ type crystals of the bismuth layer compound. The material need not be completely homogeneous and may contain a distinct phase or phases. Although the piezoelectric ceramic material is believed to have lanthanoid (Ln) substituted predominantly at the $M''$, site in $M''Bi_4Ti_4O_{15}$ type crystals, the lanthanoid may partially substitute at another site and/or partially exist along grain boundaries.

The piezoelectric ceramic material of the invention generally has an overall composition: $(M''_{1-a}Ln_a)Bi_4Ti_4O_{15}$. Where it further contains manganese oxide and/or cobalt oxide, the overall composition may be represented by the same formula, with MnO and CoO added thereto. The composition may somewhat deviate from the formula. For example, the ratio of ($M''$+Ln) to Ti and the ratio of Bi to Ti may deviate approximately ±5% from the stoichiometry. For example, Qmax can be enhanced by increasing the ratio of Bi to Ti. Also, the oxygen content varies depending on the valence of metal elements and oxygen defects.

The piezoelectric ceramic material of the invention may contain lead oxide, chromium oxide, iron oxide, etc. as impurities or trace additives although the contents of these oxides should preferably be no more than 0.5% by mass of the overall material, calculated as oxides of the stoichiometric composition such as $PbO$,, $Cr_2O_3$ and $Fe_2O_3$. More preferably the total content of these oxides is no more than 0.5% by mass. The benefits of the invention would be impaired if the contents of these oxides are greater than the limit. Although it is most desired that the piezoelectric ceramic material be free of lead, the inclusion of lead in the limited amount gives rise to no substantial problem.

The piezoelectric ceramic material of the invention includes crystal grains which are of spindle or needle shape. The mean grain size is not critical although it is preferably 1 to 10 $\mu$m, more preferably 3 to 5 $\mu$m in the major axis direction.

The piezoelectric ceramic material may have a Curie point of 380° C. or higher, and even 430° C. or higher.

The piezoelectric ceramic material is suited in constructing resonators and high-temperature sensors, for example.

Second Embodiment

Like the first embodiment, the piezoelectric ceramic material in the second embodiment has the $M''Bi_4Ti_4O_{15}$ composition. Unlike the first embodiment, it is used in the thickness extensional vibration mode.

Continuing a study on the $SrBi_4Ti_4O_{15}$ bismuth layer compound, we have found the compositional range within which an unexpectedly high Qmax is obtained when used at the third harmonic of thickness extensional vibration. The piezoelectric ceramic material in the second embodiment has a composition within this range.

Figure 2:
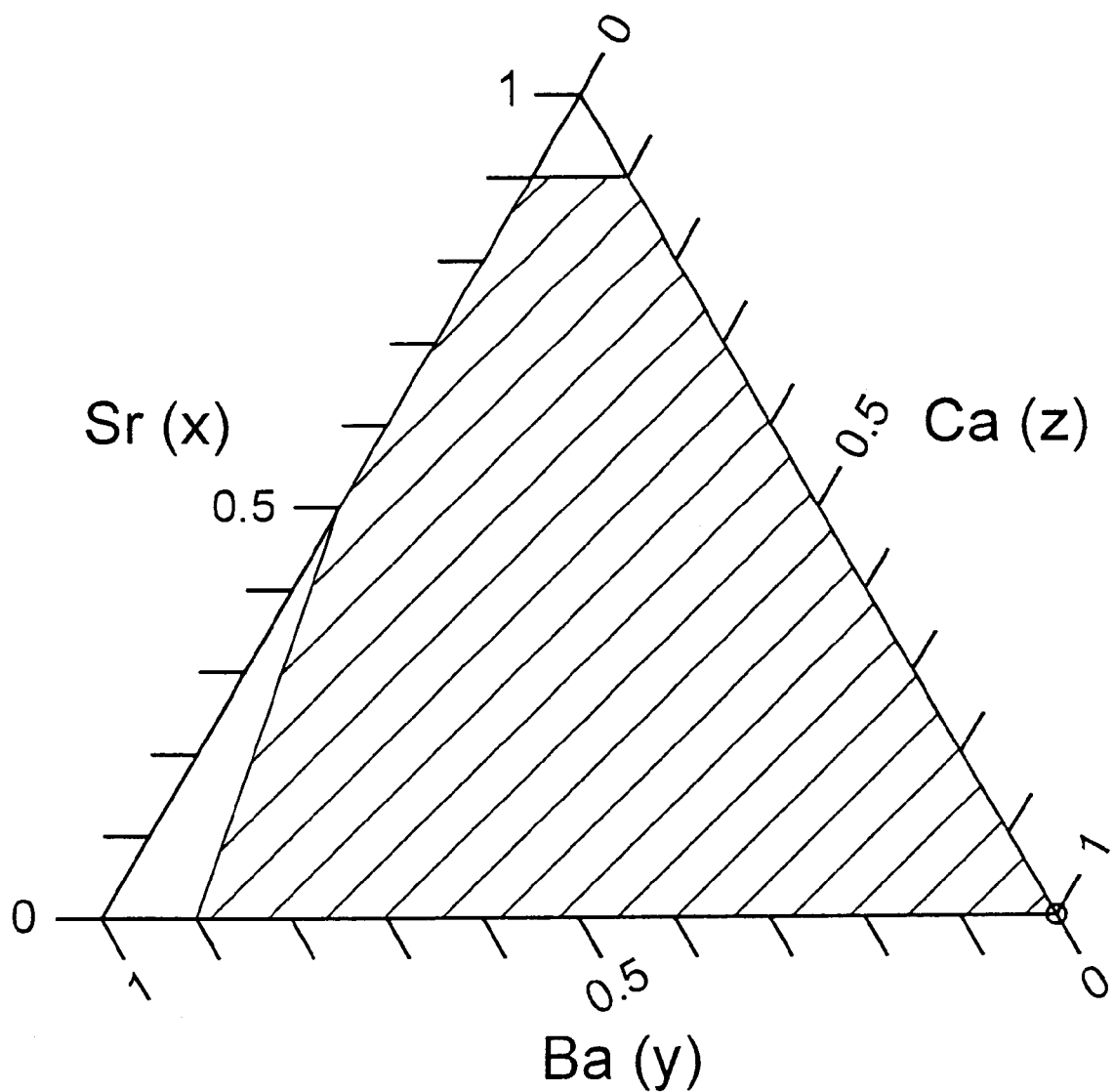
FIG. 2 is a ternary diagram showing the preferred compositional region of a piezoelectric ceramic material according to the second embodiment of the invention.
Figure 3:
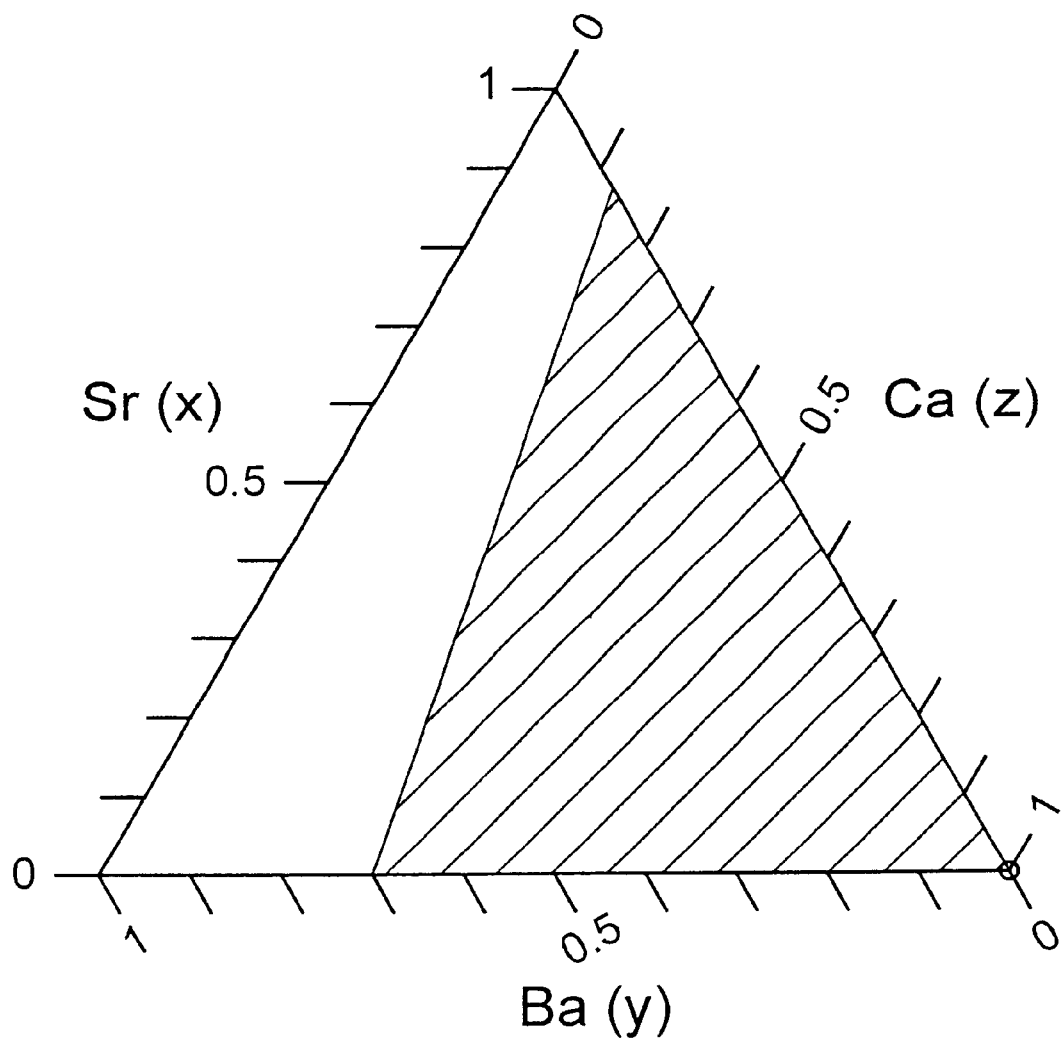
FIG. 3 is a ternary diagram showing the more preferred compositional region of a piezoelectric ceramic material according to the second embodiment of the invention.

Provided that $M''$ is represented by the formula: $Sr_xBa_y$-$Ca_z$ wherein x, y and z representing the atomic proportions of Sr, Ba and Ca, respectively, the piezoelectric ceramic material in the second embodiment requires that x, y and z be $$x+y+z=1, 0 \leq x < 0.9, 0 \leq y \leq 0.9, \text{ and } 0 \leq z < 1,$$

and preferably $y \leq -0.8 x+0.9$. That is, it is preferred that x, y and z fall in the hatched region in the ternary diagram of FIG. 2. It is more preferred that z satisfy: $-0.2 x +0.3 \leq z$, that is, x, y and z fall in the hatched region in the ternary diagram of FIG. 3.

Third embodiment

The piezoelectric ceramic material in the third embodiment is a modification of the piezoelectric ceramic material in the first embodiment wherein calcium is the sole element $M''$ and lanthanoid oxide is essential. The piezoelectric ceramic material in the third embodiment is not limited in its operation mode and may be used in the thickness shear vibration mode and any other vibration mode.

Because of the inclusion of lanthanoid oxide, the piezoelectric ceramic material in the third embodiment has higher Qmax than lanthanoid oxide-free $CaBi_4Ti_4O_{15}$ base ceramic materials. Although the lanthanoid oxide-free $CaBi_4Ti_4O_{15}$ base ceramic materials are difficult to polarize as previously mentioned, the inclusion of lanthanoid oxide facilitates polarization.

Preparation method

One exemplary method of preparing the piezoelectric ceramic material of the invention is described below.

Starting materials are oxides or compounds which will convert to oxides upon firing, for example, carbonates, hydroxides, oxalates and nitrates, and specifically $M''CO_3$, $Bi_2O_3$, $TiO_2$, $La_2O_3$, $MnO_2$, and $MnCO_3$, all in powder form. They are wet mixed in a ball mill or suitable mixer.

The mixture is then calcined. Most often, the mixture is preformed before calcination. The calcining temperature is preferably about 700 to 1,000° C., and more preferably about 750 to 850° C. Outside the range, lower calcining temperatures may result in short calcination because chemical reaction does not proceed to completion. Higher calcining temperatures may cause the preform to be sintered so that the preform becomes difficult to pulverize. The calcining time is usually about 1 to 3 hours though not critical.

The thus calcined preform is then wet pulverized in a ball mill, yielding a slurry. Through this milling, the calcined product is pulverized into powder particles which preferably have a mean particle size of about 1 to 5 $\mu$m for ease of subsequent molding though not critical.

After the wet pulverization, the calcined powder is dried. A suitable amount (about 4 to 8% by mass) of water is added to the powder, which is press molded into a compact under a pressure of about 100 to 400 MPa. In this step, a binder such as polyvinyl alcohol may be added to the powder.

The compact is then fired to yield a piezoelectric ceramic. The firing temperature is preferably in the range of about 1,100 to 1,250° C. and the firing time is preferably about 1 to 5 hours. Firing may be carried out in air, an atmosphere having a lower or higher oxygen partial pressure than air, or a pure oxygen atmosphere.

After firing, the compact is subjected to polarization treatment. The polarizing conditions are properly determined in accordance with the composition of the piezoelectric ceramic material. The conditions commonly used for polarization include a temperature of about 150 to 250° C., a time of about 1 to 30 minutes, and an electric field of at least 1.1 times the coercive electric field.

EXAMPLE

Examples of the invention are given below by way of illustration and not by way of limitation.

Example 1 (corresponding to 1st and 3rd embodiments)

Piezoelectric ceramic samples as shown in Table 1 were prepared as follows.

The starting ingredients used were $SrCO_3$, $BaCO_3$, $CaCO_3$, $Bi_2O_3$, $TiO_2$, $Ln_2O_3$, and $MnCO_3$, all in powder form. These ingredients were blended so as to give a final composition: $(Sr_xBa_yCa_z)_{1-a}Ln_aBi_4Ti_4O_{15}+MnO$, and wet milled for 16 hours in a ball mill using pure water and zirconia balls. Table 1 shows the values of x, y, z and "a" representative of the atomic ratios of Sr, Ba, Ca and Ln in the final composition, respectively, and the content of manganese oxide calculated as MnO.

The mixture was then fully dried, preformed, and calcined in air for 2 hours. The calcining temperature was selected in the range of 800 to 1,000° C. The calcined preform was crushed in a mortar, ground in an attritor, and pulverized for 16 hours in a ball mill, followed by drying. Then 6% by mass of pure water was added to the powder as a binder, which was press molded into a rectangular compact of 40 mm×40 mm×13 mm thick. The compact was packed in vacuum and pressed in an isostatic press under a pressure of 245 MPa.

Then the compact was fired in a closed container of MgO for preventing evaporation of bismuth. The firing temperature was selected in the range of 1,120 to 1,235° C. and the firing time was 4 hours.

From the sintered body, a block of 30 mm×10 mm×5.5 mm thick was cut. A silver paste was applied to the top and bottom surfaces of the block and baked at 650° C. for 10 minutes to form silver electrodes.

The block was subjected to polarization treatment by placing it in a silicone oil bath at 250° C. and applying an electric field of at least 1.1 x$E_c$ (MV/m). Note that $E_c$ is the coercive electric field of the sintered body at 250° C.

From the polarized block, a plate having planar dimensions of 30 mm×5.5 mm and a thickness of 0.45 mm was cut. The plate was lapped to a thickness of 325 μm. The plate was cut into a chip having planar dimensions of 7 mm×3 mm such that the side of 3 mm was parallel to the polarization direction. Silver electrodes were formed on the top and bottom surfaces of the chip by evaporation for the evaluation of thickness shear vibration. The silver electrodes had a diameter of 1.5 mm and a thickness of 1 μm.

Using an impedance analyzer model HP4194A by Hewlett Packard, each sample was measured for impedance in the fundamental wave mode of thickness shear vibration, from which Qmax was determined. The results are shown in Table 1.

Also, each sample was measured for resonance frequency fr at a temperature in the range of −40° C. to 85° C. Using the resonance frequency $fr_T$ at a temperature T (T=−40° C., −10° C., 20° C., 50° C. and 85° C.) and the resonance frequency $fr_{20}$ at 20° C., a change Δfr of resonance frequency from that at 20° C. was determined according to the equation:

$$\Delta fr = fr_T/fr_{20}.$$

As a result, fr showed a substantially linear change in the range of T=−40° C. to 85° C. Then the temperature dependency of Δfr was linearly approximated by the minimum square method, and the temperature dependency of resonance frequency was evaluated in terms of the gradient (frTC in Table 1). The lower the frTC, the less is the temperature dependency of resonance frequency.

For each sample, the c-axis length of $M''Bi_4Ti_4O_{15}$ type crystals was measured as follows. First, the sintered body was ground. Silicon powder as a reference substance was added to the ground material in a volume ratio of about ⅕ to ⅓. They were mixed in an agate mortar. The mixture was analyzed by a powder x-ray diffraction analyzer (Mac Science Co.) using a target of CuKα, a tube voltage of 45 kV, and a tube current of 40 mA. Analysis was effected by the continuous scanning method over a 2θ measurement range of 10 to 60° and at a scanning speed of 1°/min, obtaining an x-ray diffraction profile. After the x-ray diffraction profile was smoothened and the reflection caused by $CuK\alpha_2$ line was removed, the positions of peaks were determined. For the respective peaks attributable to silicon mixed as the reference substance, the difference between the measured 2θ in the profile and the 2θ value of the silicon peak described in JCPDS card No. 27-1402 was determined and averaged. The thus obtained average is a corrected value of 2θ. Next, to the respective peaks in the x-ray diffraction profile, indexes of plane were assigned based on $BaBi_4Ti_4O_{15}$ in JCPDS card No. 35-0757. Next, for fourteen selected peaks of (006), (008), (0010), (101), (103), (105), (107), (109), (110), (0018), (1110), (200), (1118) and (219), lattice constants were computed from the indexes of the peaks and the corrected value of 2θ by the error function automatic computing method. It is noted that where peaks to be computed are difficult to distinguish because of their overlap or where a peak to be computed overlaps any peak of silicon, that peak was excluded from computation.

TABLE 1

1st and 3rd embodiments: thickness shear fundamental vibration

| Sample No. | Sr content x | Ba content y | Ca content z | Ln type | Ln content a | MnO (mass %) | Qmax | frTC (ppm/° C.) | c-axis length (Å) |
|---|---|---|---|---|---|---|---|---|---|
| 101 | 1.000 | — | — | La | 0.1 | 0.31 | 20.6 | −87 | 41.00 |
| 102 | 0.889 | 0.111 | — | La | 0.1 | 0.31 | 18.8 | −77 | 41.10 |
| 103 | 0.778 | 0.222 | — | La | 0.1 | 0.31 | 19.5 | −65 | 41.18 |
| 104 | 0.556 | 0.444 | — | La | 0.1 | 0.31 | 18.2 | −49 | 41.41 |
| 105 | 0.333 | 0.667 | — | La | 0.1 | 0.31 | 17.7 | −43 | 41.57 |
| 106 | 0.889 | — | 0.111 | La | 0.1 | 0.31 | 19.0 | −86 | 40.97 |
| 107 | 0.778 | — | 0.222 | La | 0.1 | 0.31 | 21.4 | −84 | 40.96 |
| 108 | 0.556 | — | 0.444 | La | 0.1 | 0.31 | 19.0 | −79 | 40.86 |
| 109 | 0.333 | — | 0.667 | La | 0.1 | 0.31 | 24.5 | −78 | 40.81 |
| 110 | — | — | 1.000 | La | 0.1 | 0.31 | 25.2 | −77 | 40.68 |
| 111 | 0.556 | 0.222 | 0.222 | La | 0.1 | 0.31 | 10.3 | −61 | 41.07 |

As is evident from Table 1, all the samples show fully high values of Qmax. By selecting the compositional ratio in $M''$, the absolute value of frTC can be reduced to 50 ppm/° C. or less. In Table 1, frTC (absolute) values of less than 50 ppm/° C. are available when the $M''Bi_4Ti_4O_{15}$ type crystals have a c-axis length of at least 41.30 Å.

Comparative sample No. 112 was prepared as was sample No. 101 except that only barium was used as $M''$. Comparative sample No. 113 was prepared as was comparative sample No. 112 except that lanthanum was omitted. The compacts of these comparative samples melted down upon firing.

The samples in Table 1 all had a Curie temperature of higher than 382° C. Of these samples, those samples containing lanthanoid oxide and those samples free of lanthanoid oxide were compared by taking photomicrographs on their sections under a scanning electron microscope. It was found that as a result of inclusion of lanthanoid oxide, the sintered body was more consolidated, with fewer voids. The samples in Table 1 were analyzed by the powder x-ray diffraction method, finding a single phase of $M''Bi_4Ti_4O_{15}$ type crystals.

Example 2 (corresponding to 1st embodiments)

Piezoelectric ceramic samples were prepared as was sample No. 104 except that the elements shown in Table 2 were used as the lanthanoid (Ln). They were similarly analyzed, with the results shown in Table 2.

TABLE 2

1st embodiment: thickness shear fundamental vibration

| Sample No. | Sr content x | Ba content y | Ca content z | Ln type | Ln content a | MnO (mass %) | Qmax | frTC (ppm/° C.) |
|---|---|---|---|---|---|---|---|---|
| 201 | 0.556 | 0.444 | — | Sm | 0.1 | 0.31 | 8.9 | −45 |
| 202 | 0.556 | 0.444 | — | Gd | 0.1 | 0.31 | 6.9 | −45 |
| 203 | 0.556 | 0.444 | — | Yb | 0.1 | 0.31 | 5.8 | −48 |
| 204 | 0.556 | 0.444 | — | Nd | 0.1 | 0.31 | 6.9 | −46 |
| 205 | 0.556 | 0.444 | — | Dy | 0.1 | 0.31 | 4.6 | −44 |
| 206 | 0.556 | 0.444 | — | Ho | 0.1 | 0.31 | 4.0 | −45 |
| 207 | 0.556 | 0.444 | — | Er | 0.1 | 0.31 | 2.4 | −46 |

The samples in Table 2, which are samples having added thereto a lanthanoid other than lanthanum, were fired under the same conditions as La—containing sample No. 104. This indicates that for these samples, the firing conditions were not optimized. For this reason, these samples showed noticeably lower values of Qmax than the La—containing samples. However, the temperature dependency of resonance frequency is at least comparable to La-containing sample No. 104.

It is noted that the c-axis length of $M''Bi_4Ti_4O_{15}$ type crystals in the samples in Table 2 was substantially equal to that in sample No. 104.

The samples in Table 2 all had a Curie temperature of higher than 382° C. Like the lanthanoid oxide—containing samples in Table 1, it was found for the samples in Table 2 that the sintered body was more consolidated. The samples in Table 2 were analyzed by the powder x-ray diffraction method, finding a single phase of $M''Bi_4Ti_4O_{15}$ type crystals.

Example 3 (corresponding to 2nd and 3rd embodiments)

Sintered bodies were prepared as in Example 1 except that the composition was changed as shown in Table 3.

From each sintered body, a plate having planar dimensions of 30 mm×30 mm and a thickness of 0.55 mm was cut. The plate was lapped to a thickness of 435 μm. Copper electrodes were formed on the top and bottom surfaces of the plate by evaporation. Polarization treatment was carried out as in Example 1 except that the electric field strength was changed to 1.5 $xE_c$ (MV/m).

The copper electrodes were etched away using a $FeCl_3$ solution. The plate was cut into a chip having planar dimensions of 7 mm×4.5 mm such that the thickness direction was aligned with the polarization direction. Silver electrodes were formed on the top and bottom surfaces of the chip by evaporation for the evaluation of thickness extensional vibration. The silver electrodes had a diameter of 1.5 mm and a thickness of 1 μm.

Using an impedance analyzer model HP4194A by Hewlett Packard, each sample was measured for impedance in the third harmonic mode of thickness extensional vibration, from which Qmax was determined. The results are shown in Table 3.

TABLE 3

2nd and 3rd embodiments: thickness extensional vibration (3rd order harmonic)

| Sample No. | Sr content x | Ba content y | Ca content z | Ln type | Ln content a | MnO (mass %) | Qmax |
|---|---|---|---|---|---|---|---|
| 301 | 0.333 | — | 0.667 | La | 0.1 | 0.31 | 18.0 |
| 302 | — | — | 1.000 | La | 0.1 | 0.31 | 14.8 |
| 303* | 1.000 | — | — | La | 0.1 | 0.31 | 7.6 |

*comparison

It is seen from Table 3 that by selecting the composition of piezoelectric ceramic within the range defined by the second embodiment, fully high values of Qmax are obtained even when the third harmonic of thickness extensional vibration is used. Table 3 also shows that fully high values of Qmax are obtained in the third embodiment.

The samples in Table 3 all had a Curie temperature of higher than 500° C. The samples in Table 3 were analyzed by the powder x-ray diffraction method, finding a single phase of $M''Bi_4Ti_4O_{15}$ type crystals.

There has been described a lead-free piezoelectric ceramic material having an increased Qmax and enabling stable oscillation at a low voltage.

Japanese Patent Application Nos. 11-310177 and 2000-313936 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A method comprising operating a piezoelectric device in the thickness shear vibration mode, wherein the piezoelectric device comprises a piezoelectric ceramic material comprising a bismuth layer compound containing $M''$, Bi, Ti and O wherein $M''$ is at least one element selected from the group consisting of Sr, Ba and Ca, and containing $M''Bi_4Ti_4O_{15}$ type crystals, wherein $M''$ is represented by the formula: $Sr_xBa_yCa_z$ wherein x, y and z representing the atomic proportions of Sr, Ba and Ca, respectively, satisfy x+y+z=1, $0 \leq x \leq 1$, $0 \leq y \leq 0.9$, and $0 \leq z \leq 1$, said piezoelectric ceramic material further comprising a lanthanoid oxide wherein Ln represents the lanthanoid, and the atomic ratio Ln/(Ln+M$^{II}$) is in the range: 0<Ln/(Ln+M$^{II}$)<0.5.

2. The method of claim 1 wherein y is in the range: x/6+0.2≦y≦0.8.

3. The method of claim 1 wherein the piezoelectric ceramic material further comprises manganese oxide.

4. A method comprising operating a piezoelectric device in the thickness shear vibration mode, wherein the piezoelectric device comprises a piezoelectric ceramic material comprising a bismuth layer compound containing M$^{II}$, Bi, Ti and O wherein M$^{II}$ is at least one element selected from the group consisting of Sr, Ba and Ca, and containing M$^{II}$Bi$_4$Ti$_4$O$_{15}$ type crystals having a c-axis length of at least 41.00 Å, said piezoelectric ceramic material further comprising a lanthanoid oxide wherein Ln represents the lanthanoid, and the atomic ratio Ln/(Ln+M$^{II}$) is in the range: 0<Ln/(Ln+M$^{II}$) <0.5.

5. The method of claim 4 wherein the M$^{II}$Bi$_4$Ti$_4$O$_{15}$ type crystals have a c-axis length of at least 41.30 Å.

6. The method of claim 4 wherein the M$^{II}$Bi$_4$Ti$_4$O$_{15}$ type crystals have a c-axis length of up to 41.80 Å.

7. The method of claim 4 wherein the piezoelectric ceramic material further comprises manganese oxide.

8. A method comprising operating a piezoelectric device in the thickness extensional vibration mode, wherein the piezoelectric device comprises a piezoelectric ceramic material comprising a bismuth layer compound containing M$^{II}$, Bi, Ti and O wherein M$^{II}$ is at least one element selected from the group consisting of Sr, Ba and Ca, and containing M$^{II}$Bi$_4$Ti$_4$O$_{15}$ type crystals, wherein M$^{II}$ is represented by the formula: Sr$_x$Ba$_y$Ca$_z$ wherein x, y and z representing the atomic proportions of Sr, Ba and Ca, respectively, satisfy x+y+z =1, 0≦x≦0.9, 0≦y≦0.9, and 0≦z<1, said piezoelectric ceramic material further comprising a lanthanoid oxide wherein Ln represents the lanthanoid, and the atomic ratio Ln/(Ln+M$^{II}$) is in the range: 0<Ln/(Ln+M$^{II}$) <0.5.

9. The method of claim 8 wherein y is in the range: y≦-0.8 x+0.9.

10. The method of claim 8 wherein z is in the range: -0.2 x+0.3 ≦z.

11. The method of claim 8 therein the piezoelectric ceramic material further comprises manganese oxide.

12. A method comprising operating a piezoelectric device in the thickness extensional vibration node, wherein the piezoelectric device comprises a piezoelectric ceramic material comprising a bismuth layer compound containing Ca, Bi, Ti, Ln and O wherein Ln is a lanthanoid, and containing CaBi$_4$Ti$_4$O$_{15}$ type crystals, wherein the atomic ratio Ln/(Ln+Ca) is in the range: 0<Ln/(Ln+Ca)<0.5.

13. The method of claim 12 wherein the piezoelectric ceramic material further comprises manganese oxide.

14. The method of claim 12 wherein Q$_{max}$≧14.8.

15. A piezoelectric device adapted to operate in the thickness shear vibration mode, wherein the piezoelectric device comprises a piezoelectric ceramic material comprising a bismuth layer compound containing M$^{II}$, Bi, Ti and O wherein M$^{II}$ is at least one element selected from the group consisting of Sr, Ba and Ca, and containing M$^{II}$Bi$_4$Ti$_4$O$_{15}$ type crystals, wherein M$^{II}$ is represented by the formula: Sr$_x$Ba$_y$Ca$_z$ wherein x, y and z representing the atomic proportions of Sr, Ba and Ca, respectively, satisfy x+y+z=1, 0≦x≦1, 0≦y≦0.9, and 0≦z≦1, said piezoelectric ceramic material further comprising a lanthanoid oxide wherein Ln represents the lanthanoid, and the atomic ratio Ln/(Ln+M$^{II}$) is in the range: 0≦Ln/(Ln+M$^{II}$)<0.5.

16. The piezoelectric device of claim 15 wherein y is in the range: x/6 +0.2 ≦y≦0.8.

17. The piezoelectric device of claim 15 wherein the piezoelectric ceramic material further comprises manganese oxide.

18. A piezoelectric device adapted to operate in the thickness shear vibration mode, wherein the piezoelectric device comprises a piezoelectric ceramic material comprising a bismuth layer compound containing M$^{II}$, Bi, Ti and O wherein M$^{II}$ is at least one element selected from the group consisting of Sr, Ba and Ca, and containing M$^{II}$Bi$_4$Ti$_4$O$_{15}$ type crystals having a c-axis length of at least 41.00 Å, said piezoelectric ceramic material further comprising a lanthanoid oxide wherein Ln represents the lanthanoid, and the atomic ratio Ln/(Ln+M$^{II}$) is in the range: 0<Ln/(Ln+M$^{II}$)<0.5.

19. The piezoelectric device of claim 18 wherein the M$^{II}$Bi$_4$Ti$_4$O$_{15}$ type crystals have a c-axis length of at least 41.30 Å.

20. The piezoelectric device of claim 18 wherein the M$^{II}$Bi$_4$Ti$_4$O$_{15}$ type crystals have a c-axis length of up to 41.80 Å.

21. The piezoelectric device of claim 16 wherein the piezoelectric ceramic material further comprises manganese oxide.

22. A piezoelectric device adapted to operate in the thickness extensional vibration mode, wherein the piezoelectric device comprises a piezoelectric ceramic material comprising a bismuth layer compound containing M$^{II}$, Bi, Ti and O wherein M$^{II}$ is at least one element selected from the group consisting of Sr, Ba and Ca, and containing M$^{II}$Bi$_4$Ti$_4$O$_{15}$ type crystals, wherein M$^{II}$ is represented by the formula: Sr$_x$Ba$_y$Ca$_z$ wherein x, y and z representing the atomic proportions of Sr, Ba and Ca, respectively, satisfy x+y+z=1, 0≦x< 0.9, 0≦y≦0.9, and 0≦z<1, said piezoelectric ceramic material further comprising a lanthanoid oxide wherein Ln represents the lanthanoid, and the atomic ratio Ln/(Ln+M$^{II}$) is in the range: 0<Ln/(Ln+M$^{II}$)<0.5.

23. The piezoelectric device of claim 22 wherein y is in the range: y≦-0.8 x +0.9.

24. The piezoelectric device of claim 22 wherein z is in the range: -0.2 x+0.3≦z.

25. The piezoelectric device of claim 22 wherein the piezoelectric ceramic material further comprises manganese oxide.

26. A piezoelectric device adapted to operate in the thickness extensional vibration mode, wherein the piezoelectric device comprises a piezoelectric ceramic material comprising a bismuth layer compound containing Ca, Bi, Ti, Ln and O wherein Ln is a lanthanoid, and containing CaBi$_4$Ti$_4$O$_{15}$ type crystals, wherein the atomic ratio Ln/(Ln+Ca) in the range: 0<Ln/(Ln+Ca)<0.5.

27. The piezoelectric device of claim 26 wherein the piezoelectric ceramic material further comprises manganese oxide.

28. The piezoelectric device of claim 26 wherein Q$_{max}$≧14.8.

* * * * *

UNITED STATES PATENT AND TRADEMARK OFFICE
CERTIFICATE OF CORRECTION

PATENT NO. : 6,461,532 B1
DATED : October 8, 2002
INVENTOR(S) : Hitoshi Oka et al.

It is certified that error appears in the above-identified patent and that said Letters Patent is hereby corrected as shown below:

Column 11,
Line 34, "$0 \leq x \leq 0.9$," should read -- $0 \leq x < 0.9$, --;
Line 43, "claim 8 therein" should read -- claim 8 wherein --.

Column 12,
Line 4, "$0 \leq Ln/(Ln+M^{II}) < 5$." should read -- $0 < Ln/(Ln+M^{II}) < 5$. --;
Line 27, "claim 16 wherein" should read -- claim 18 wherein --.
Line 57, "in the range:" should read -- is in the range: --.

Signed and Sealed this

Seventeenth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,461,532 B1
DATED : October 8, 2002
INVENTOR(S) : Hitoshi Oka et al.

It is certified that error appears in the above-identified patent and that said Letters Patent is hereby corrected as shown below:

Column 12,
Line 4, "$0 < Ln/(Ln+M^{II}) < 5.$" should read -- $0 < Ln/(Ln+M^{II}) < 0.5.$ --.

Signed and Sealed this

Fourth Day of November, 2003

JAMES E. ROGAN
*Director of the United States Patent and Trademark Office*